(12) United States Patent
Yoshikawa et al.

(10) Patent No.: US 9,693,458 B2
(45) Date of Patent: Jun. 27, 2017

(54) PRINTED WIRING BOARD, METHOD FOR MANUFACTURING PRINTED WIRING BOARD AND PACKAGE-ON-PACKAGE

(71) Applicant: IBIDEN CO., LTD., Ogaki-shi (JP)

(72) Inventors: Kazuhiro Yoshikawa, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 193 days.

(21) Appl. No.: 14/509,354

(22) Filed: Oct. 8, 2014

(65) Prior Publication Data
US 2015/0098204 A1 Apr. 9, 2015

(30) Foreign Application Priority Data
Oct. 8, 2013 (JP) .................. 2013-210868

(51) Int. Cl.
*H05K 1/14* (2006.01)
*H01L 21/48* (2006.01)
(Continued)

(52) U.S. Cl.
CPC ......... *H05K 1/144* (2013.01); *H01L 21/4853* (2013.01); *H01L 23/00* (2013.01);
(Continued)

(58) Field of Classification Search
CPC .............. H05K 1/144; H05K 2203/054; H01L 21/4853; H01L 23/00
(Continued)

(56) References Cited

U.S. PATENT DOCUMENTS

2012/0328857 A1* 12/2012 Yajima .................. H05K 3/0097
428/212
2013/0168144 A1* 7/2013 Jeong .................... H05K 3/4007
174/257
(Continued)

FOREIGN PATENT DOCUMENTS

JP 2003-008228 A 1/2003

OTHER PUBLICATIONS

U.S. Appl. No. 14/504,842, filed Oct. 2, 2014, Yoshikawa, et al.
U.S. Appl. No. 14/504,969, filed Oct. 2, 2014, Yoshikawa, et al.

*Primary Examiner* — Eric Thomas
*Assistant Examiner* — Michael P McFadden
(74) *Attorney, Agent, or Firm* — Oblon, McClelland, Maier & Neustadt, L.L.P.

(57) ABSTRACT

A method for manufacturing a printed wiring board includes forming a resin layer on an interlayer layer such that the resin layer has first openings exposing circuits in central portion and second openings exposing circuits in peripheral portion of the interlayer layer, forming solder bumps on the circuits in the first openings, forming a plating resist over the bumps and resin layer such that the resist has openings having diameters greater than the second openings and exposing the second openings, forming a seed layer on the resist, in the openings and on the circuits through the second openings, applying electrolytic plating on the resist such that electrolytic plating fills the openings and forms a plated film on the resist and metal posts in the openings, etching the plating such that the plated film is removed and recesses are formed on end surfaces of the posts, and removing the resist.

20 Claims, 9 Drawing Sheets

(51) Int. Cl.
*H01L 23/00* (2006.01)
*H05K 3/40* (2006.01)
*H01L 23/498* (2006.01)
*H01L 25/10* (2006.01)

(52) U.S. Cl.
CPC ...... *H01L 23/49811* (2013.01); *H01L 25/105* (2013.01); *H05K 3/4007* (2013.01); *H01L 23/49822* (2013.01); *H01L 23/49827* (2013.01); *H01L 24/16* (2013.01); *H01L 2224/131* (2013.01); *H01L 2224/13111* (2013.01); *H01L 2224/16237* (2013.01); *H01L 2224/81192* (2013.01); *H01L 2224/81801* (2013.01); *H01L 2924/12042* (2013.01); *H01L 2924/181* (2013.01); *H01L 2924/18161* (2013.01); *H05K 2203/054* (2013.01)

(58) Field of Classification Search
USPC ........................................................ 361/767
See application file for complete search history.

(56) References Cited

U.S. PATENT DOCUMENTS

| | | | |
|---|---|---|---|
| 2013/0206466 A1* | 8/2013 | Inagaki ............... | H01L 21/4857 174/262 |
| 2013/0206468 A1* | 8/2013 | Rathburn ........... | H01R 43/0256 174/263 |
| 2014/0077389 A1* | 3/2014 | Shim ................. | H01L 23/49816 257/774 |

* cited by examiner

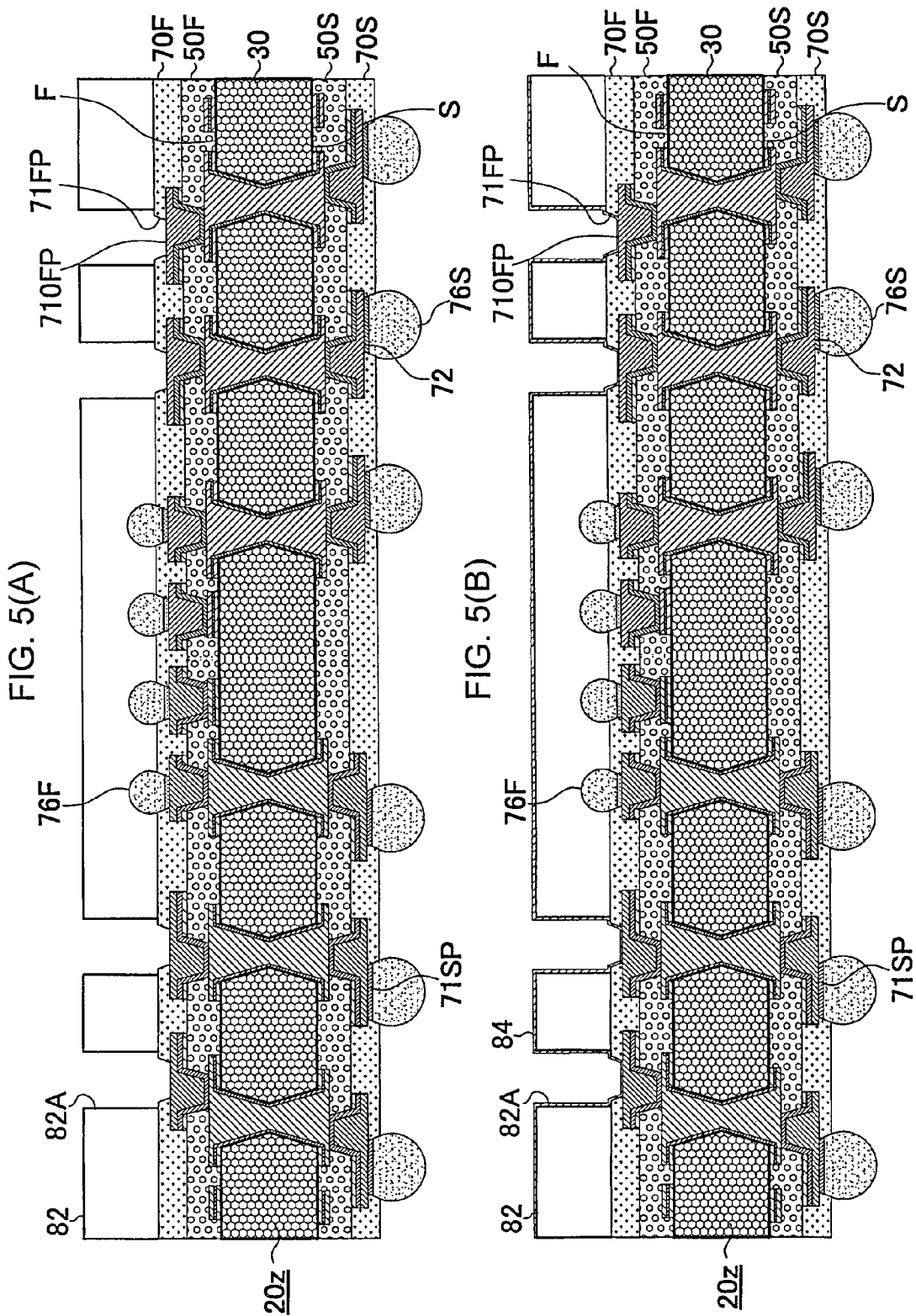

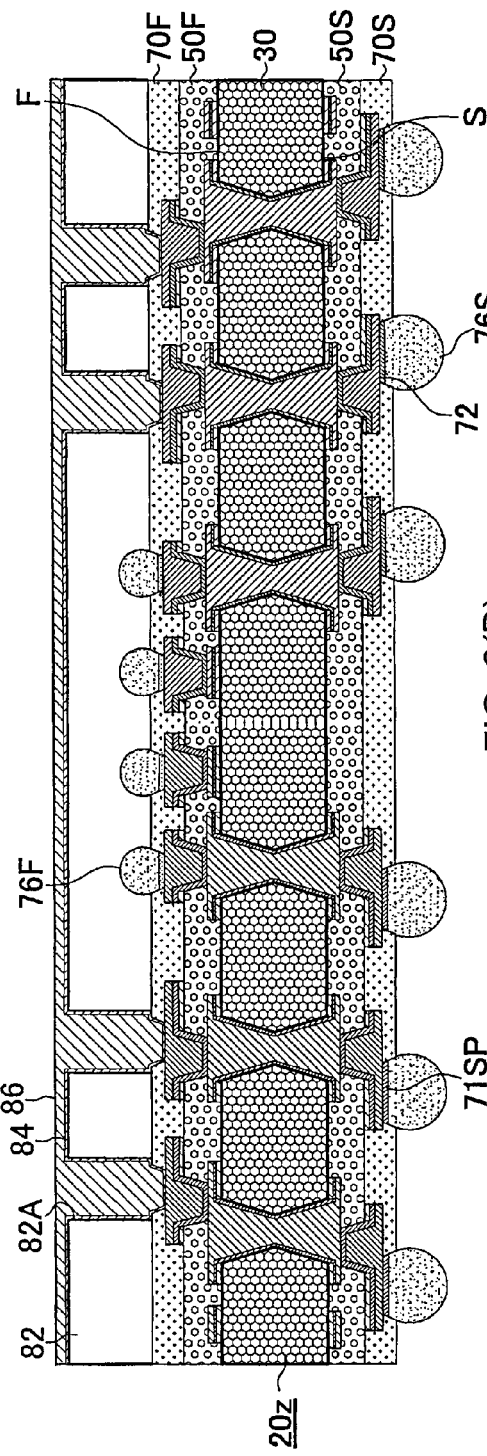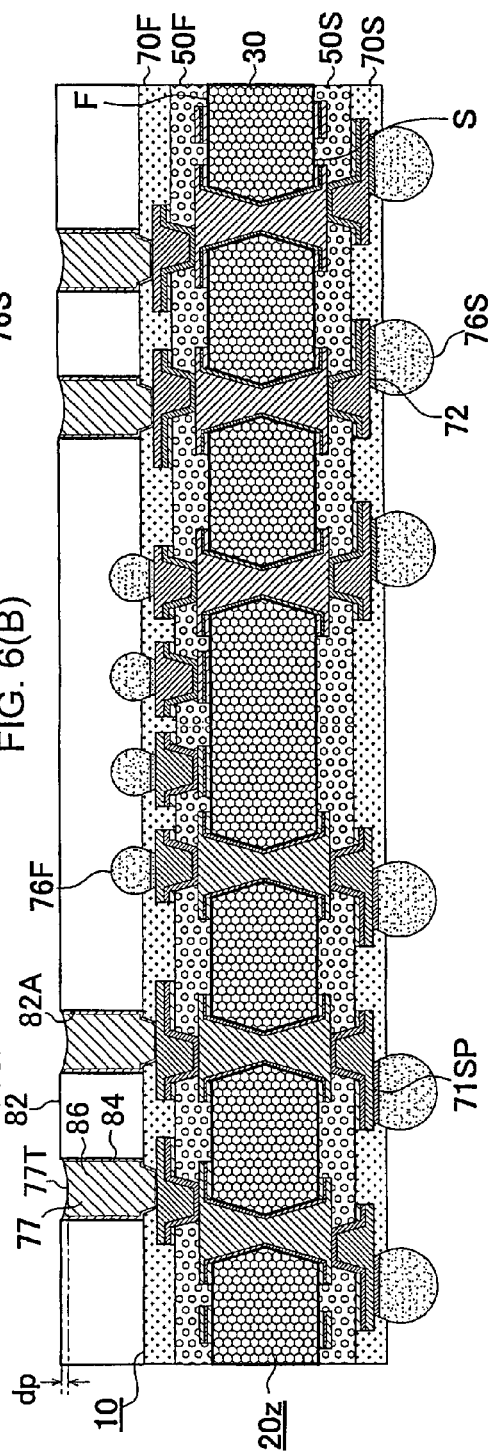

PRINTED WIRING BOARD, METHOD FOR MANUFACTURING PRINTED WIRING BOARD AND PACKAGE-ON-PACKAGE

CROSS-REFERENCE TO RELATED APPLICATIONS

The present application is based upon and claims the benefit of priority to Japanese Patent Application No. 2013-210868, filed Oct. 8, 2013, the entire contents of which are incorporated herein by reference.

BACKGROUND OF THE INVENTION

Field of the Invention

The present invention relates to a printed wiring board having metal posts for mounting another printed wiring board (upper substrate) and to a method for manufacturing such a printed wiring board.

Description of Background Art

JP2003-8228A describes a method for forming a metal post on a pad of a printed wiring board. The entire contents of this publication are incorporated herein by reference.

SUMMARY OF THE INVENTION

According to one aspect of the present invention, a method for manufacturing a printed wiring board includes forming a resin insulation layer on an interlayer resin insulation layer such that the resin insulation layer has first opening portions exposing conductive circuits formed in a central portion of the interlayer resin insulation layer and second opening portions exposing conductive circuits formed in a peripheral portion of the interlayer resin insulation layer, forming solder bumps in the first opening portions such that the solder bumps are formed on the conductive circuits in the central portion of the interlayer resin insulation layer, respectively, forming a plating resist over the solder bumps and the resin insulation layer such that the plating resist has resist opening portions having diameters greater than diameters of the second opening portions and exposing the second opening portions, forming a seed layer on the plating resist such that the seed layer is formed on the plating resist, in the resist opening portions and on the conductive circuits exposed through the second opening portions, applying electrolytic plating on the plating resist such that an electrolytic plating material fills the resist opening portions and forms an electrolytic plated film on the plating resist via the seed layer and metal posts in the resist opening portions, respectively, etching the electrolytic plating material such that the electrolytic plated film on the plating resist is removed and recess portions are formed on surfaces of the metal posts in the resist opening portions, respectively, and removing the plating resist.

According to another aspect of the present invention, a printed wiring board includes an interlayer resin insulation layer, pads formed on the interlayer resin insulation layer, and metal posts formed on the pads and having recess portions on end surfaces of the metal posts.

According to yet another aspect of the present invention, a package-on-package device includes a first substrate, an IC chip mounted on the first substrate, a second substrate mounted on the first substrate, and a mold resin layer filling a space formed between the first substrate and the IC chip. The first substrate includes an interlayer resin insulation layer, first pads formed on the interlayer resin insulation layer such that the first pads are positioned in a central portion of the interlayer resin insulation layer and formed to mount an IC chip, second pads formed on the interlayer resin insulation layer such that the second pads are positioned in a peripheral portion of the interlayer resin insulation layer and formed to connect to a second substrate, a resin insulation layer formed on the interlayer resin insulation layer and the first and second pads such that the resin insulation layer has first opening portions exposing the first pads in the central portion of the interlayer resin insulation layer and second opening portions exposing the second pads in the peripheral portion of the interlayer resin insulation layer, and metal posts having recess portions on end surfaces of the metal posts and formed on the second pads in the peripheral portion of the interlayer resin insulation layer, respectively, the mold resin layer has opening portions exposing the end surfaces of the metal posts, respectively, the first substrate has first bumps mounting the IC chip on the pad portions in the central portion of the interlayer resin insulation layer, and the second substrate has second bumps connecting to the end surfaces of the metal posts exposed from the opening portions of the mold resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5(A)-5(B) show steps for manufacturing metal posts of a printed wiring board according to the first embodiment;

FIG. 6(A)-6(B) show steps for manufacturing metal posts of a printed wiring board according to the first embodiment;

DETAILED DESCRIPTION OF THE EMBODIMENTS

Figure 1:
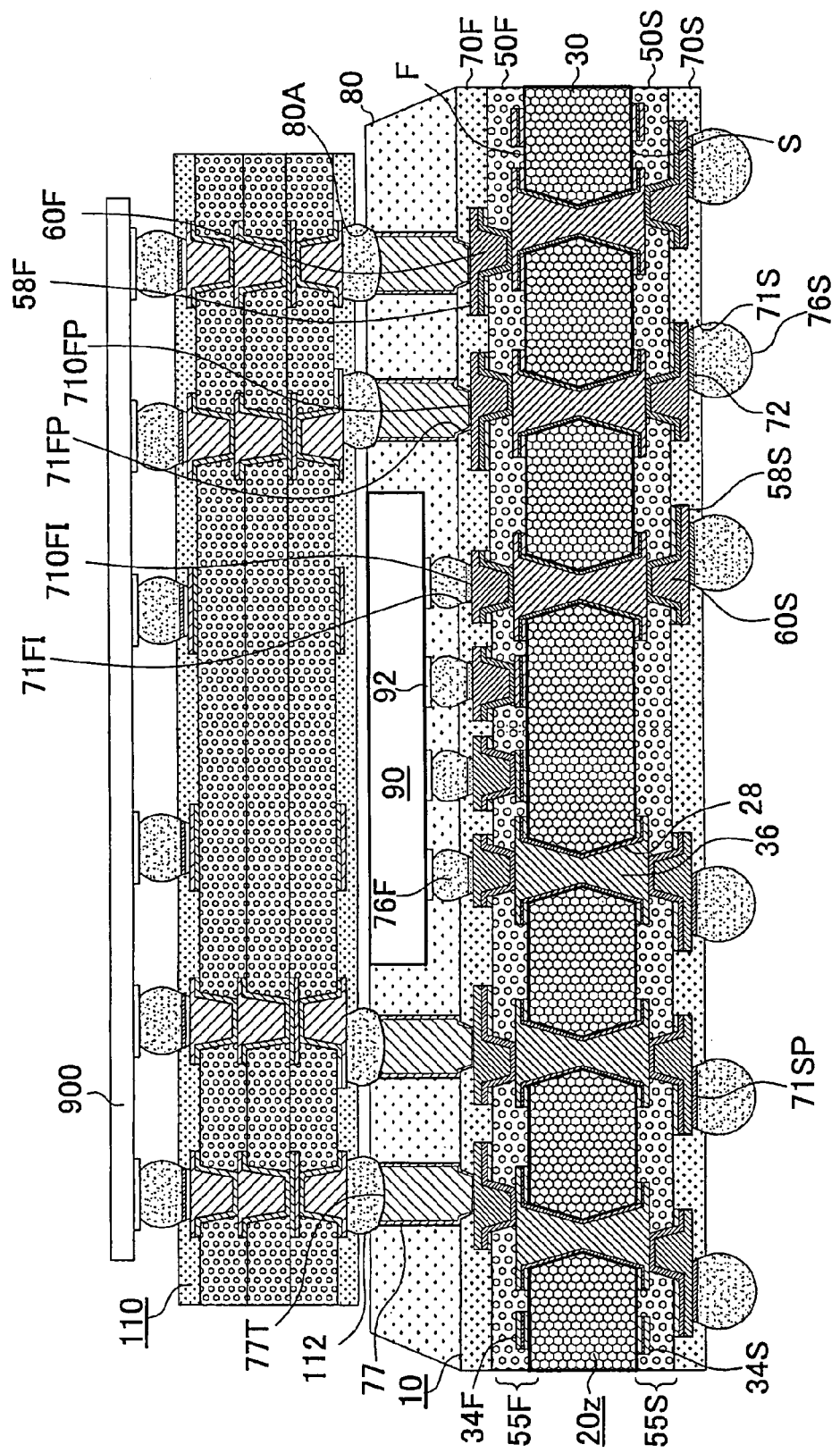
FIG. 1 shows a cross-sectional view of an applied example of a printed wiring board according to a first embodiment of the present invention.

The embodiments will now be described with reference to the accompanying drawings, wherein like reference numerals designate corresponding or identical elements throughout the various drawings.

First Embodiment

Figure 4A:
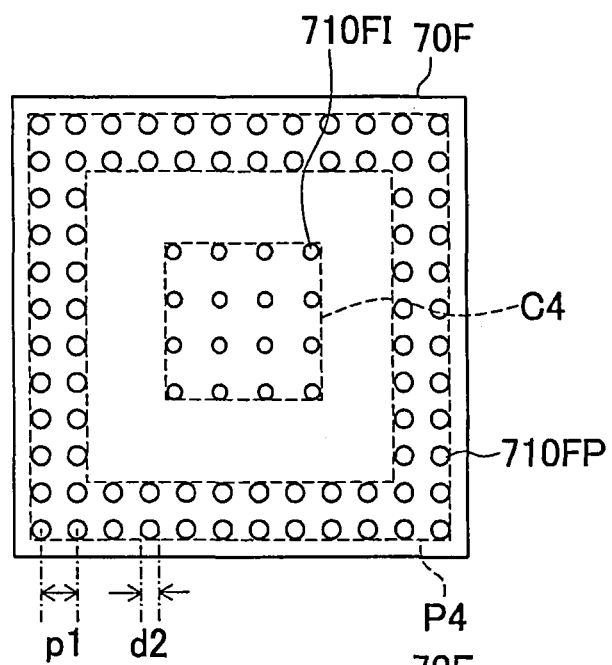
FIG. 4(A) is a plan view of a mounting surface, and 4(B) is a view showing a mounting surface with metal posts.

FIG. 1 shows an applied example of printed wiring board 10 according to a first embodiment of the present invention. Printed wiring board 10 has pads (first pads) (710FI) for mounting electronic component 90 such as an IC chip, and pads (second pads) (710FP) for mounting another printed wiring board (upper substrate) 110. Electronic component 900 such as a memory is mounted on the other printed wiring board. Pad group (C4) is formed with multiple pads (710FI) (see FIG. 4(A)), and pad group (C4) is formed in an approximate center of printed wiring board 10. Pads (710FP) are formed in peripheral region (P4) surrounding pad group (C4) (see FIG. 4(A)). On pads (710FP), bonding posts (metal posts) 77 for mounting an upper substrate are formed. The shape of the metal posts is a circular column, for example. Metal posts 77 work to electrically connect printed wiring board 10 and printed wiring board 110. In addition, even if pitch (p1) of pads (710FP) is 0.3 mm or less, the distance between printed wiring board 10 of the present embodiment and printed wiring board (upper substrate) 110 is secured by metal posts 77. Because of metal posts 77, a constant distance is maintained between printed wiring board 10 of the embodiment and printed wiring board (upper substrate) 110 even when pitch (p1) of pads (710FP) is 0.25 mm or less. Insulation is maintained between adjacent pads. Pitch (p1) is the distance between the centers of adjacent pads (710FP).

The printed wiring board of the present embodiment may have a core substrate, or it may be a coreless printed wiring board. A printed wiring board with a core substrate and its manufacturing method are described in JP2007-227512A, for example. The entire contents of JP2007-227512A are incorporated herein by reference. A coreless substrate and its manufacturing method are described in JP2005-236244A, for example. Such a coreless substrate is formed by alternately laminating an interlayer resin insulation layer and a conductive layer, and all the interlayer resin insulation layers each have a thickness of 60 μm or less, for example.

Printed wiring board 10 of the first embodiment has core substrate 30. The core substrate has insulative base (20z) having first surface (F) and second surface (S) opposite the first surface, first conductive layer (34F) formed on first surface (F) of the insulative substrate and second conductive layer (34S) formed on the second surface of the insulative substrate. The core substrate is further provided with through-hole conductor 36 made by filling plating film in penetrating hole 28 for a through-hole conductor formed in insulative base (20z). Through-hole conductor 36 connects first conductive layer (34F) and second conductive layer (34S). The first surface of the core substrate corresponds to the first surface of the insulative base, and the second surface of the core substrate corresponds to the second surface of the insulative base.

Interlayer resin insulation layer (uppermost interlayer resin insulation layer) (50F) is formed on first surface (F) of core substrate 30. Conductive layer (uppermost conductive layer) (58F) is formed on interlayer resin insulation layer (50F). Conductive layer (58F) is connected to first conductive layer (34F) or a through-hole conductor by via conductor (uppermost via conductor) (60F) which penetrates through interlayer resin insulation layer (50F). Upper buildup layer (55F) is made up of interlayer resin insulation layer (50F), conductive layer (58F) and via conductors (60F). The upper buildup layer in the first embodiment is single layered. The uppermost conductive layer has pads (710FI, 710FP). Top surfaces of conductive circuits included in the uppermost conductive layer and top surfaces of uppermost via conductors make pads (710FI, 710FP).

Interlayer resin insulation layer (lowermost interlayer resin insulation layer) (50S) is formed on second surface (S) of core substrate 30. Conductive layer (lowermost conductive layer) (58S) is formed on interlayer resin insulation layer (50S). Conductive layer (58S) is connected to second conductive layer (34S) or a through-hole conductor by via conductor (lowermost via conductor) (60S) which penetrates through interlayer resin insulation layer (50S). Lower buildup layer (55S) is made up of interlayer resin insulation layer (50S), conductive layer (58S) and via conductors (60S). The lower buildup layer in the first embodiment is single layered. The lowermost conductive layer has BGA pads (71SP) for connection with a motherboard. Top surfaces of conductive circuits included in the lowermost conductive layer and top surfaces of lowermost via conductors make pads (71SP).

Upper solder-resist layer (70F) is formed on the upper buildup layer, and lower solder-resist layer (70S) is formed on the lower buildup layer. Solder-resist layer (70F) has opening (first opening) (71FI) to expose pad (710FI) and opening (second opening) (71FP) to expose pad (710FP). Solder-resist layer (70S) has opening (71S) to expose BGA pad (71SP). On pad (710FI) and BGA pad (71SP), solder bumps (76F, 76S) are formed to be respectively connected to an electronic component and a motherboard. It is an option not to form solder bumps, and instead of solder bumps to form connection material such as Sn film.

Figure 3:
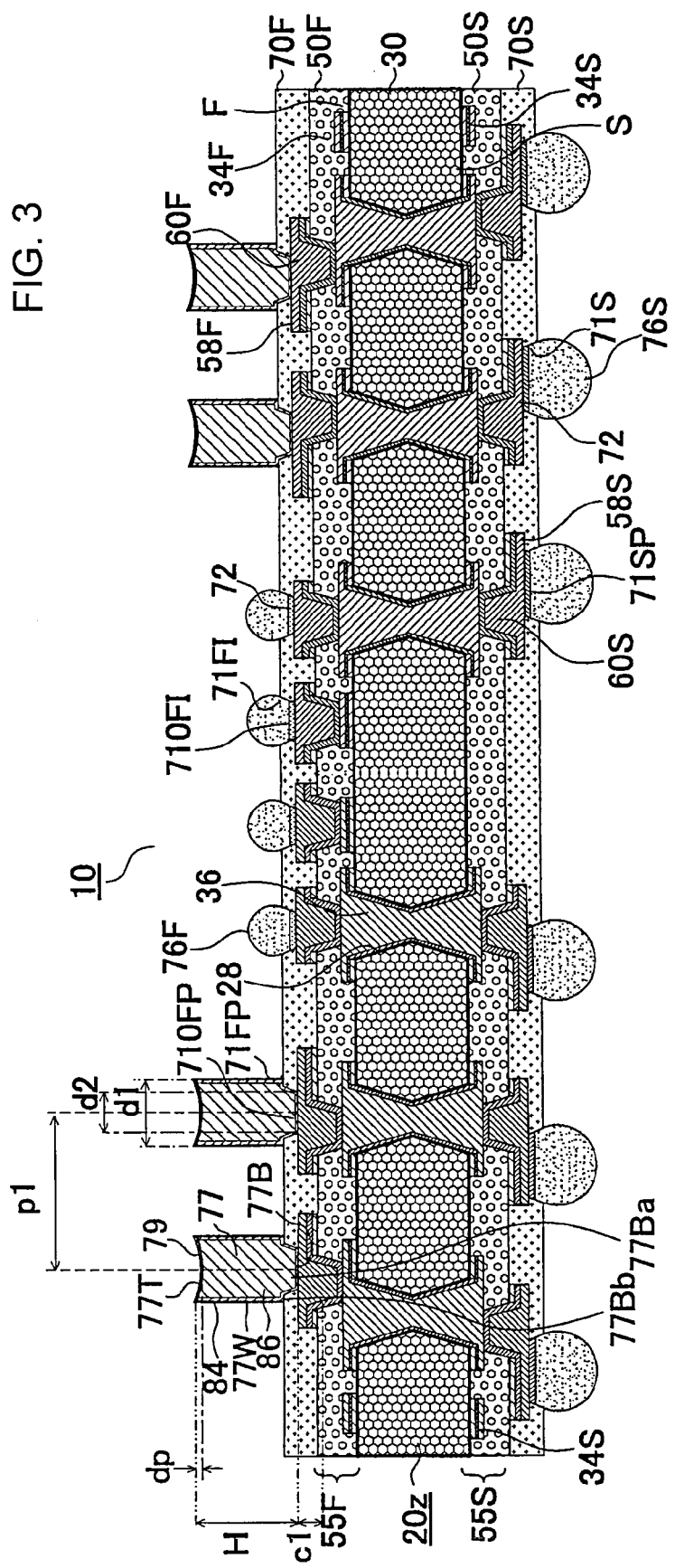
FIG. 3 shows a cross-sectional view of a printed wiring board after metal posts are formed in the first embodiment.

FIG. 3 is a cross-sectional view of printed wiring board 10 of the present embodiment having solder bumps (76F, 76S). Its mounting surface is provided with upper solder-resist layer (70F) and pads (710FI, 710FP). Metal post 77 is formed on pad (710FP).

Metal post 77 has top portion (77T) and its opposing bottom portion (77B). A recess with a depth (dp) of 5~30 μm is formed in top portion (77T), and Ni/Au film 79 is formed on the surface of top portion (77T). Bottom portion (77B) has beheaded circular cone (77Ba) corresponding to the shape of opening (71FP) in solder-resist layer (70F), and ring portion (77Bb) shaped as a ring abutting the surface of solder-resist layer (70F). Metal post 77 has sidewall (77W) between its top and bottom portions. Ti/Cu seed layer 84 is formed on the surfaces of sidewall (77W) and bottom portion (77B). Electrolytic plated film 86 is filled in the portion coated with the seed layer. Since Ti/Cu seed layer 84 is formed on sidewall (77W) and Ni/Au film 79 is provided on top portion (77T), metal post 77 exhibits excellent anticorrosion properties. The tip end of beheaded circular cone (77Ba) at the bottom of a metal post faces pad (710FP).

Figure 4B:
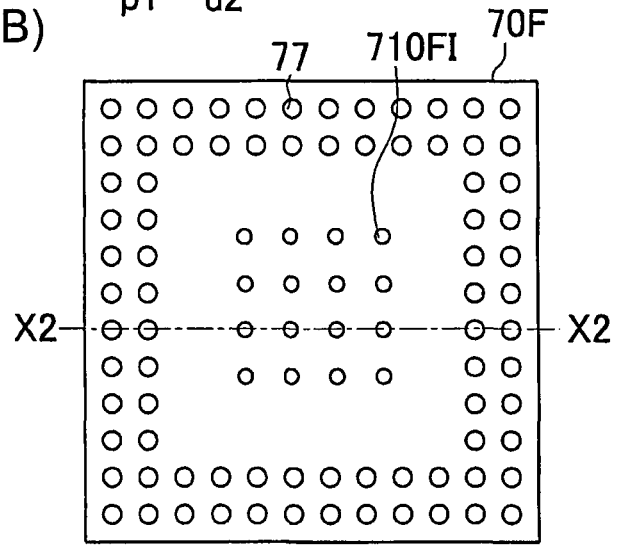
Figures 7A, 7B:
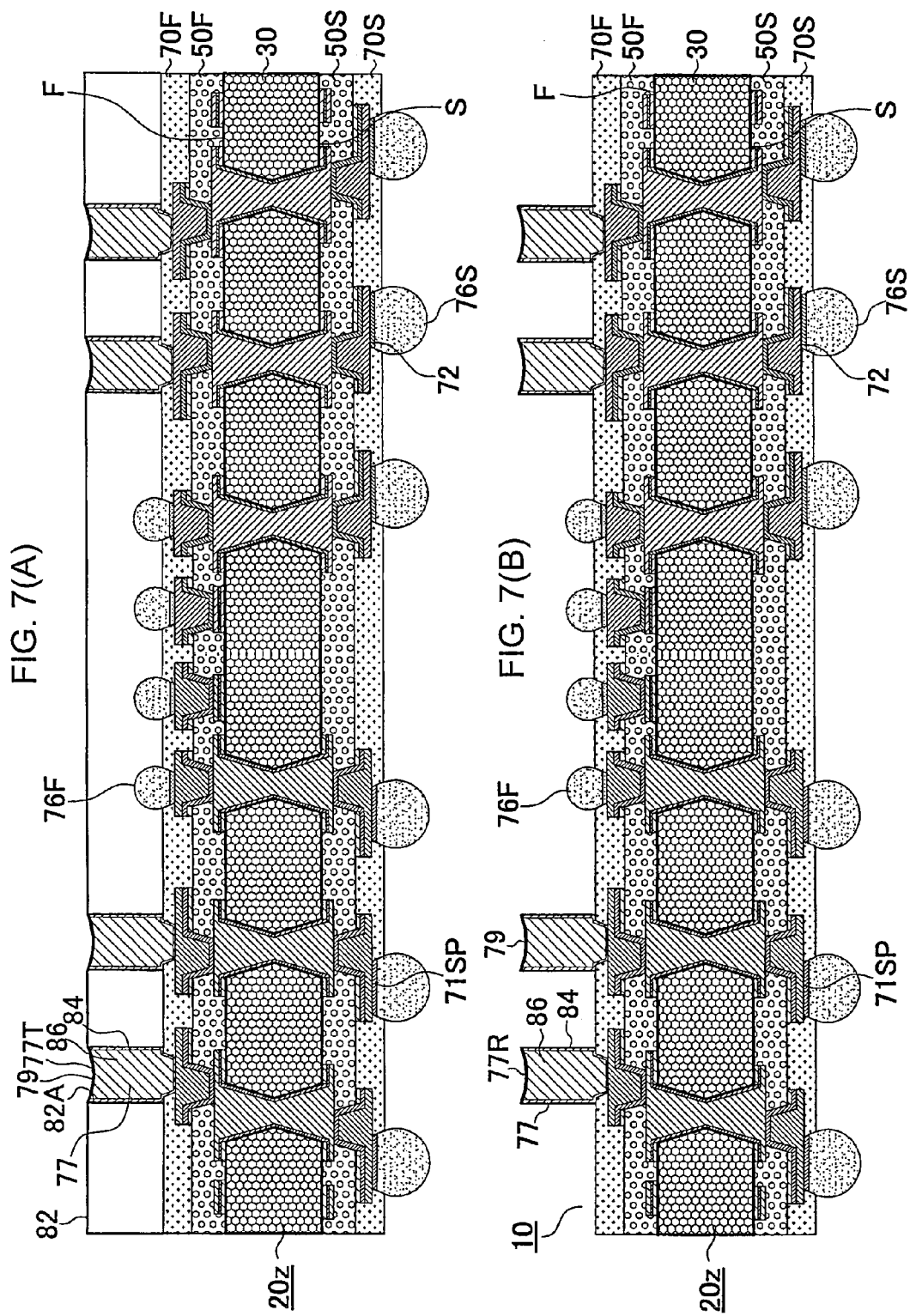
FIG. 7(A)-7(B) show steps for manufacturing metal posts of a printed wiring board according to the first embodiment.

FIG. 3 shows a cross-sectional view of printed wiring board 10 taken at X2-X2 in FIG. 4(B). The shape of metal post shown in FIGS. 3 and 4(B) is a circular column. Diameter (d2) of pad (710FP) is 45 μm~140 μm. The diameter of a pad is that of the conductor (conductive circuit or via conductor) exposed from the solder-resist layer. Diameter (d1) of metal post 77 (diameter at the top portion of the metal post) is set greater than diameter (d2). Diameter (d1) is 50 μm~150 μm. Regarding diameter (d2) of a pad and diameter (d1) of a metal post, the ratio (d2/d1) is preferred to be 0.5~0.9. Set at such a ratio, the pitch of the pads is reduced. Even if pitch (p1) is 0.3 mm or less, connection reliability is high between printed wiring board 10 and the upper substrate. Also, insulation reliability is high between metal posts. Distance (pitch) (p1) between adjacent pads (710FP) is 100 μm~300 μm. Pitch (p1) less than 100 μm tends to decrease insulation reliability between metal posts. Such a pitch makes metal posts thinner, resulting in lowered connection reliability between the upper substrate and printed wiring board 10. Pitch (p1) exceeding 300 μm increases the size of printed wiring board 10. Accordingly, stress exerted on metal posts increases and connection reliability decreases between the upper substrate and printed wiring board 10.

When pitch (p1) is 0.3 mm or less, height (H) (distance from the upper surface to the bottom surface) of metal post 77 is 75 μm~200 μm, and diameter (d1) of metal post 77 is 75 μm~150 μm. Connection reliability is enhanced between the printed wiring board of the embodiment and the upper substrate, and insulation reliability is improved between metal posts.

When pitch (p1) is 0.25 mm or less, height (H) of metal post 77 is 100 μm~200 μm, and diameter (d1) of metal post 77 is 50 μm~150 μm. Connection reliability is enhanced between the printed wiring board of the embodiment and the upper substrate, and insulation reliability is improved between metal posts.

The aspect ratio (height H/diameter d1) of a metal post is preferred to be greater than 1. A metal post with such a ratio mitigates stress between the printed wiring board of the present embodiment and the upper substrate, resulting in enhanced connection reliability. The aspect ratio (H/d1) is preferred to be 0.6~3. Stress is mitigated between printed wiring board 10 and the upper substrate. In addition, the metal post will not deteriorate from fatigue, and connection reliability is enhanced between the upper substrate and printed wiring board 10.

Regarding distance (H) from the upper surface of pad (710FP) to the top of a metal post and thickness (c1) of pad (710FP), the ratio (H/c1) is preferred to be at least 5 but 30 or smaller. When pitch (p1) is 0.3 mm or less, the value of H/c1 is preferred to be at least 7 but 25 or smaller. Since pad (710FP) is the base of a metal post, if the value of H/c1 is too great, the metal post may break off from the pad or the reliability of the metal post may decrease. On the other hand, if the value of H/c1 is too small, it is hard for the metal post to mitigate stress, and connection reliability thereby decreases.

In the first embodiment, pitch (p1) can be reduced. Since there is enough space between adjacent metal posts, insulation reliability between metal posts is high even when pitch (p1) is 0.3 mm or less. Pitch (p1) at 0.25 mm or less makes metal posts thinner. To enhance connection reliability, the aspect ratio (H/d1) of a metal post is preferred to be 0.6 or greater. When the number of pads (710FP) increases, the size of the printed wiring board increases. However, if the aspect ratio (H/d1) of a metal post is 2 or greater, such a metal post can mitigate stress caused by differences in physical properties between the upper substrate and the printed wiring board. When the value of H/d1 exceeds 3.5, the metal post deteriorates due to heat cycles. Examples of physical properties are a thermal expansion coefficient, Young's modulus and the like.

As shown in FIG. 1, printed wiring board 10 and upper substrate 110 are connected by highly rigid metal post 77. Thermal stress between the upper substrate and the printed wiring board is mitigated by metal posts 77. Metal posts 77 maintain the strength of an electronic device that includes the upper substrate and the printed wiring board. The electronic device is suppressed from warping caused by physical property differences between the upper substrate and the printed wiring board.

FIGS. 2 and 5~9 show a method for manufacturing a metal post.

Figure 2:
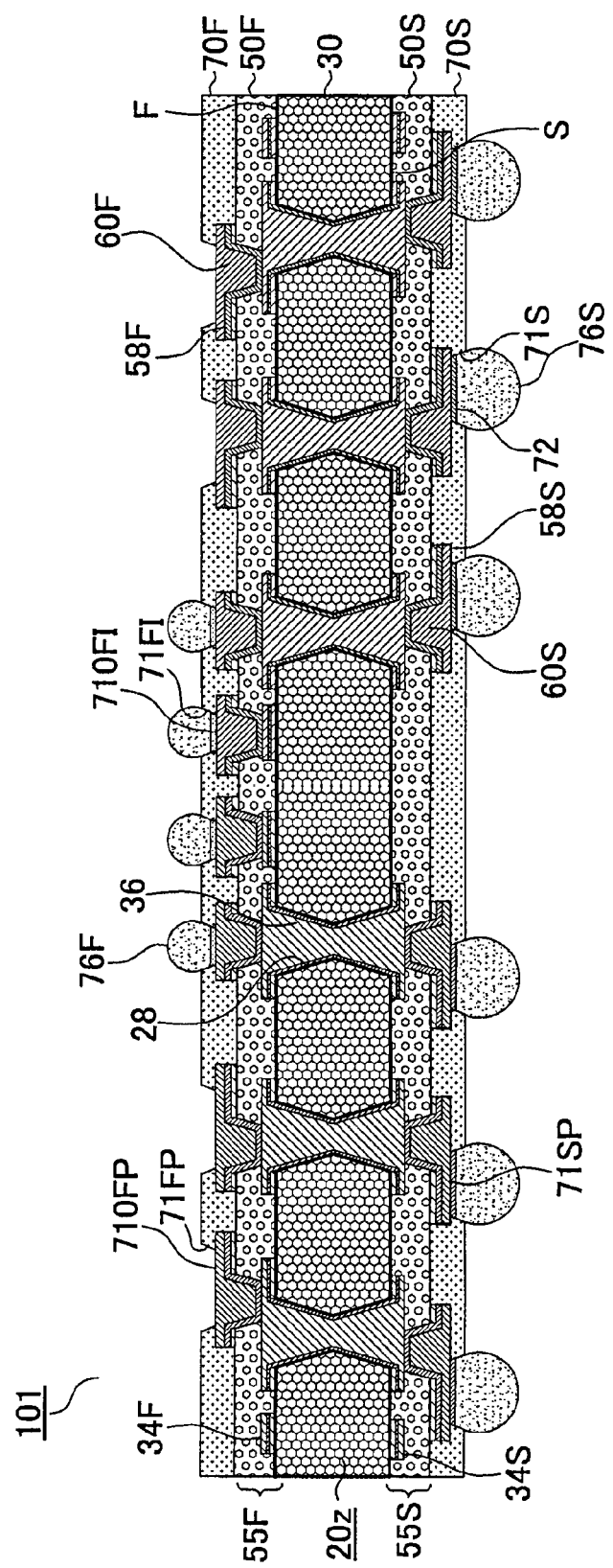
FIG. 2 shows a cross-sectional view of a printed wiring board before metal posts are formed in the first embodiment.

Printed wiring board 10 shown in FIG. 2 may be manufactured by the aforementioned method described in JP2007-227512A, for example. Printed wiring board 10 has pad (first pad) (710FI) for mounting electronic component 90 such as an IC chip and pad (second pad) (710FP) for mounting another printed wiring board (upper substrate) 110. Solder bump (C4 bump) (76F) is formed on first pad (710FI). Second pad (710FP) is exposed through second opening (71FP) of solder-resist layer (70F). Meanwhile, solder bump (76S) is formed in opening (71S) of solder-resist layer (70S).

On solder bump (76F) and solder-resist layer (70F) of printed wiring board 10, plating resist 82 is formed to have resist opening (82A) which exposes second opening (71FP) and has a diameter greater than the second opening (FIG. 5(A)). Ti/Cu seed layer 84 is formed by sputtering on plating resist 82, in resist opening (82A), and on second pad (710FP) exposed through second opening (71FP) (FIG. 5(B)). Here, a Ti/Cu seed layer is formed by sputtering; however, electroless copper plating may also be performed to form a seed layer.

Electric current is flowed through seed layer 84 to fill electrolytic copper plating in resist opening (82A) and to form electrolytic plated film 86 on plating resist 82 (FIG. 6(A)). Etching is conducted to remove electrolytic plated film 86 on plating resist 82 and to form a recess on the surface of electrolytic plating 86 filled in the resist opening, namely, in top portion (77T) of metal post 77 (FIG. 6(B)). Depth (dp) of the recess is 5~30 μm.

Surface treatment is conducted on top portion (recess) (77T) of metal post 77. Ni/Au or Ni/Pd/Au film 79 is formed as surface-treatment film (FIG. 7(A)). As for surface treatment, Sn film, solder film, OSP or the like may be used instead of Ni/Au film. Plating resist 82 is removed, side surfaces of metal post 77 are exposed, and printed wiring board 10 is completed (FIG. 7(B)).

Figure 8:
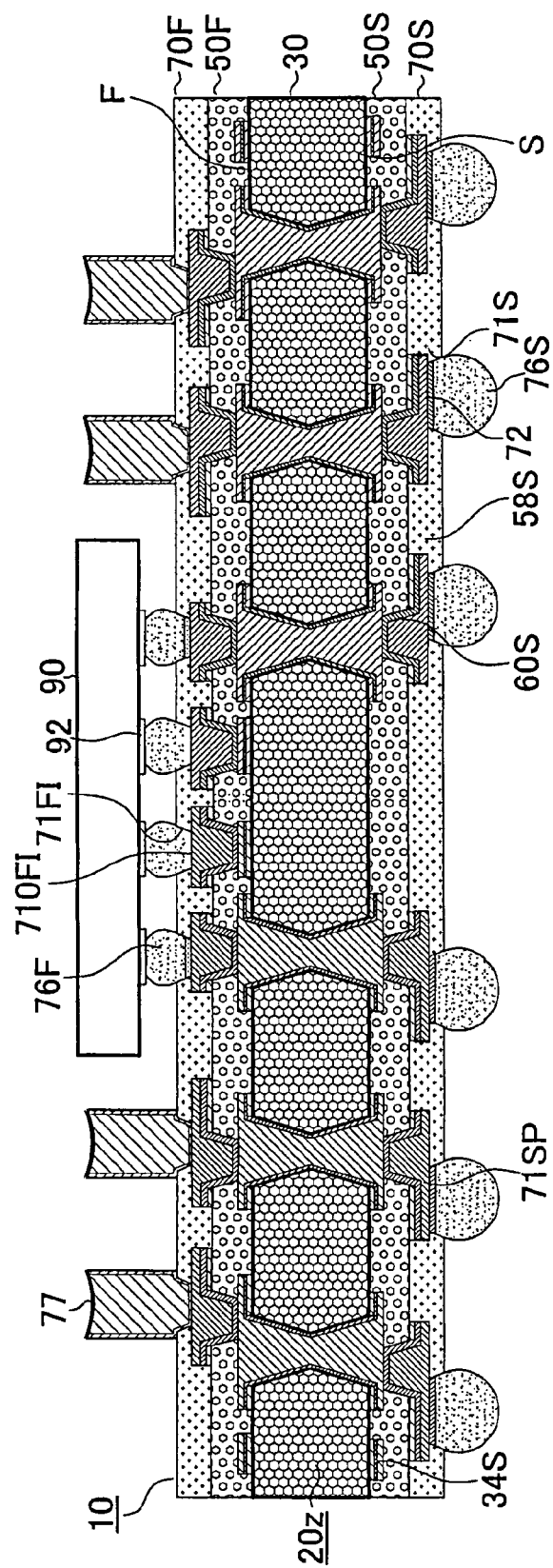
FIG. 8 shows a step for manufacturing metal posts of a printed wiring board according to the first embodiment.
Figure 9A:
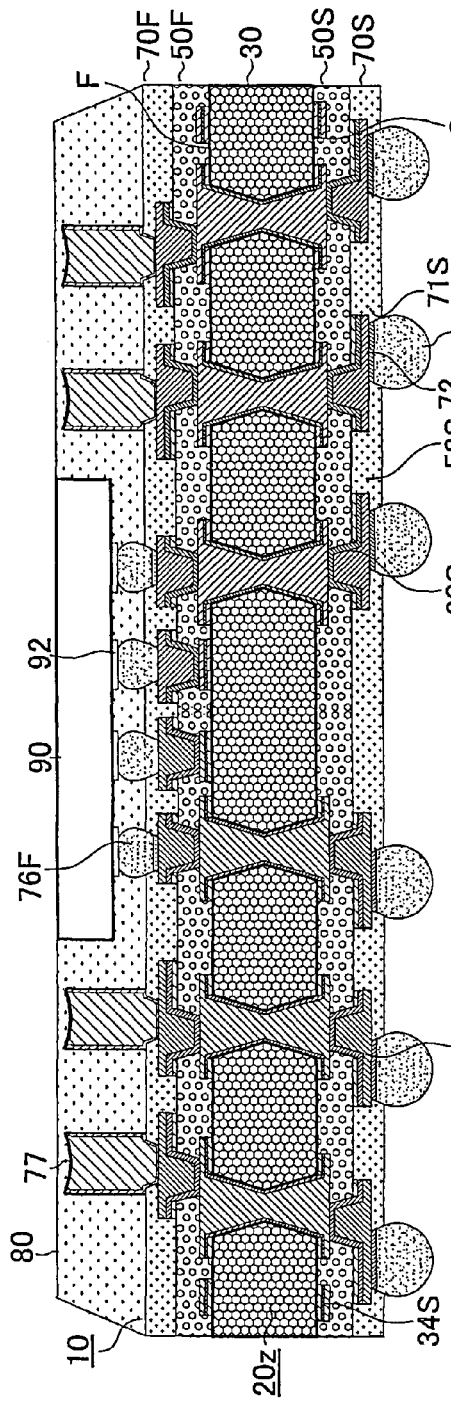
FIG. 9(A)-9(B) show steps for manufacturing metal posts of a printed wiring board according to the first embodiment.
Figure 9B:
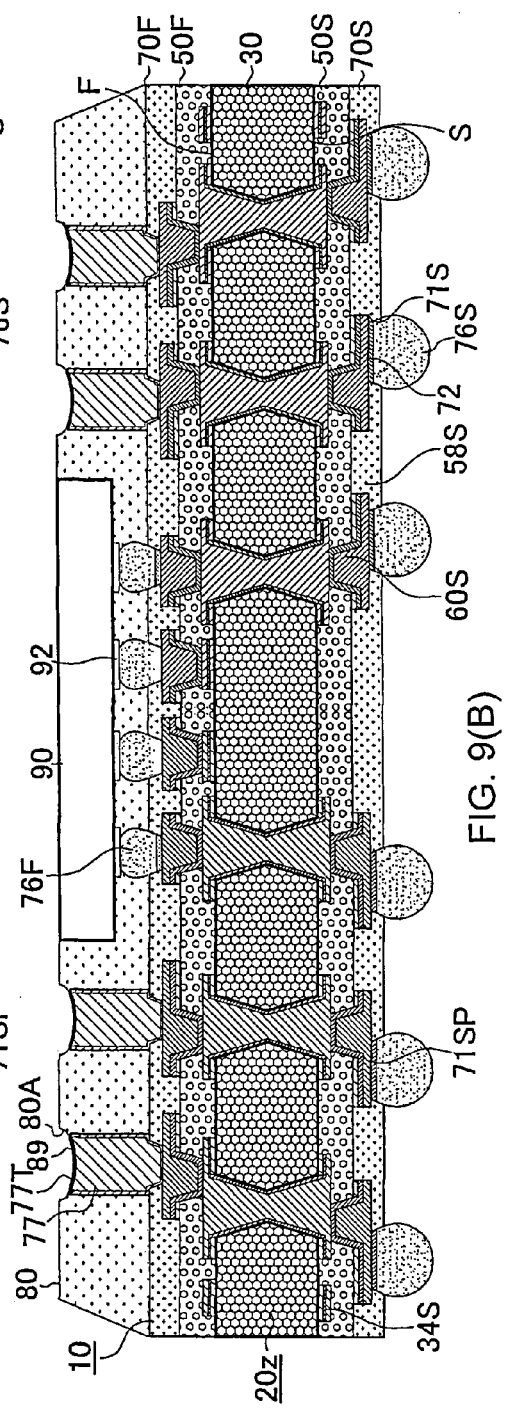

IC chip 90 is mounted on printed wiring board 10 when pad 92 of the IC chip is bonded to first pad (710FI) by means of solder bump (76F) formed on first pad (710FI) exposed in first opening (71FI) of solder-resist layer (70F) (FIG. 8). Mold resin 80 is filled on the printed wiring board to a level corresponding to the upper surface of IC chip 90 (FIG. 9(A)). Using a laser, opening (80A) is formed in mold resin 80 to expose top portion (77T) of metal post 77 (FIG. 9(B)). After that, a solder bump may be coated on opening (80A) exposed through a printing mask.

Other printed wiring board (upper substrate) 110 is bonded to metal post 77 by means of solder bump 112 so that the other printed wiring board 110 is mounted on printed wiring board 10 (FIG. 1). Since a semicircular recess is formed in top portion (77T) of metal post 77 corresponding to the semicircular curved surface of solder bump 112, the contact area increases between solder bump 112 and top portion (77T) of metal post 77, and stress from upper substrate 110 is more likely to be exerted uniformly on metal post 77. Accordingly, metal post 77 is less likely to peel off when stress from upper substrate 110 is exerted locally on the metal post, and the connection reliability between a bump of the upper substrate and a metal post is thereby enhanced.

When a printed wiring board is provided with bumps for mounting an IC chip and metal posts for mounting an upper substrate, the distance between the upper substrate and a printed wiring board becomes greater than the distance between the IC chip and the printed wiring board. Thus, connection reliability is thought to decrease when the upper substrate is connected to the printed wiring board by tall metal posts.

A printed wiring board according to an embodiment of the present invention and a method for manufacturing such a printed wiring board according to an embodiment of the present invention are capable of enhancing connection reliability between the printed wiring board and an upper substrate mounted on the printed wiring board.

A method for manufacturing a printed wiring board according to an embodiment of the present invention is characterized by the following: on the outermost interlayer resin insulation layer and conductive circuits, forming a solder-resist layer having a first opening to expose a conductive circuit in a central portion of the printed wiring board, and a second opening to expose a conductive circuit in a peripheral portion of the printed wiring board; forming a solder bump in the first opening; on the solder bump and on the solder-resist layer, forming a plating resist to have a resist opening which exposes a second opening and has a diameter greater than the second opening; forming a seed layer on the plating resist, in the resist opening, and on the conductive circuit exposed through the second opening; filling the resist opening with electrolytic plating and forming electrolytic plated film on the plating resist by means of the seed layer; conducting etching to remove the electrolytic plated film on the plating resist and to form a recess on the surface of the electrolytic plating filled in the resist opening; and removing the plating resist.

A printed wiring board according to an embodiment of the present invention has an uppermost interlayer resin insulation layer, a pad formed on the uppermost interlayer resin insulation layer, and a metal post formed on the pad. The metal post has a recess in its top portion.

In a method for manufacturing a printed wiring board according to an embodiment of the present invention, a metal post is formed by filling a resist opening with electrolytic plating and electrolytic plated film is formed on the plating resist by means of the seed layer. Then, etching is conducted to remove the electrolytic plated film on the plating resist and to form a recess on the surface of the electrolytic plating filled in the resist opening. Since a recess is formed in the top portion of a metal post, connection reliability is enhanced between a bump of the upper substrate and the metal post.

In a printed wiring board according to an embodiment of the present invention, since a metal post has a recess in its top portion, connection reliability is enhanced between a bump of the upper substrate and the metal post.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    forming a resin insulation layer on an interlayer resin insulation layer such that the resin insulation layer has a plurality of first opening portions exposing a plurality of conductive circuits formed in a central portion of the interlayer resin insulation layer and a plurality of second opening portions exposing a plurality of conductive circuits formed in a peripheral portion of the interlayer resin insulation layer;
    forming a plurality of solder bumps in the plurality of first opening portions such that the plurality of solder bumps is formed on the plurality of conductive circuits in the central portion of the interlayer resin insulation layer, respectively;
    forming a plating resist over the solder bumps and the resin insulation layer such that the plating resist has a plurality of resist opening portions having diameters greater than diameters of the plurality of second opening portions and exposing the plurality of second opening portions;
    forming a seed layer on the plating resist such that the seed layer is formed on the plating resist, in the resist opening portions and on the conductive circuits exposed through the second opening portions;
    applying electrolytic plating on the plating resist such that an electrolytic plating material fills the resist opening portions and forms an electrolytic plated film on the plating resist via the seed layer and a plurality of metal posts in the resist opening portions, respectively;
    etching the electrolytic plating material such that the electrolytic plated film on the plating resist is removed and a plurality of recess portions is formed on surfaces of the metal posts in the resist opening portions, respectively;
    applying surface-treatment on the recess portions formed on the surfaces of the metal posts prior to removing of the plating resist; and
    removing the plating resist,
    wherein the surface-treatment comprises forming a plurality of Ni/Pd/Au films on the recess portions of the metal posts, respectively, or forming a plurality of Ni/Au films on the recess portions of the metal posts, respectively.

2. A method for manufacturing a printed wiring board according to claim 1, wherein the surface-treatment includes flux treatment.

3. A method for manufacturing a printed wiring board according to claim 1, wherein the interlayer resin insulation layer is an outermost interlayer resin insulation layer, and the resin insulation layer is a solder-resist layer.

4. A printed wiring board, comprising:
    an interlayer resin insulation layer;
    a plurality of pads formed on the interlayer resin insulation layer;
    a plurality of metal posts formed on the plurality of pads and having a plurality of recess portions on end surfaces of the metal posts; and
    a plurality of surface-treatment films formed on the recess portions of the metal posts, respectively,
    wherein the plurality of surface-treatment films is one of a plurality of Ni/Pd/Au films and a plurality of Ni/Au films.

5. A printed wiring board according to claim 4, wherein each of the metal posts has a seed layer formed on a sidewall surface of each of the metal posts.

6. A printed wiring board according to claim 4, further comprising:
    a resin insulation layer having a plurality of first opening portions exposing the plurality of pads formed in a central portion of the interlayer resin insulation layer and a plurality of second opening portions exposing the plurality of pads formed in a peripheral portion of the interlayer resin insulation layer,
    wherein the plurality of metal posts is formed on the plurality of pads in the peripheral portion of the interlayer resin insulation layer.

7. A printed wiring board according to claim 4, wherein the plurality of metal posts is formed on the pads in the peripheral portion of the interlayer resin insulation layer, respectively, at a pitch in a range of 0.3 mm or smaller.

8. A printed wiring board according to claim 7, wherein each of the metal posts has a diameter in a range of 50 to 150 µm and an aspect ratio in a range of 0.6 to 3.

9. A printed wiring board according to claim 7, further comprising:
    a resin insulation layer having a plurality of first opening portions exposing the plurality of pads formed in a central portion of the interlayer resin insulation layer and a plurality of second opening portions exposing the plurality of pads formed in a peripheral portion of the interlayer resin insulation layer; and a plurality of solder bumps formed in the plurality of first opening portions such that the plurality of solder bumps is formed on the plurality of pads in the central portion of the interlayer resin insulation layer, respectively, wherein the plurality of metal posts is formed on the plurality of pads in the peripheral portion of the interlayer resin insulation layer.

10. A printed wiring board according to claim 7, wherein the plurality of metal posts comprises an electrolytic plating material.

11. A printed wiring board according to claim 7, wherein the interlayer resin insulation layer is an outermost interlayer resin insulation layer, and the resin insulation layer is a solder-resist layer.

12. A package-on-package device, comprising:
a first substrate;
an IC chip mounted on the first substrate;
a second substrate mounted on the first substrate; and
a mold resin layer filling a space formed between the first substrate and the IC chip,
wherein the first substrate includes an interlayer resin insulation layer, a plurality of first pads formed on the interlayer resin insulation layer such that the first pads are positioned in a central portion of the interlayer resin insulation layer and configured to mount the IC chip, a plurality of second pads formed on the interlayer resin insulation layer such that the second pads are positioned in a peripheral portion of the interlayer resin insulation layer and configured to connect to the second substrate, a resin insulation layer formed on the interlayer resin insulation layer and the first and second pads such that the resin insulation layer has a plurality of first opening portions exposing the first pads in the central portion of the interlayer resin insulation layer and a plurality of second opening portions exposing the second pads in the peripheral portion of the interlayer resin insulation layer, a plurality of metal posts having a plurality of recess portions on end surfaces of the metal posts and formed on the second pads in the peripheral portion of the interlayer resin insulation layer, respectively, and a plurality of surface-treatment films formed on the recess portions of the metal posts, respectively, the mold resin layer has a plurality of opening portions exposing the end surfaces of the metal posts, respectively, the first substrate has a plurality of first bumps mounting the IC chip on the first pads in the central portion of the interlayer resin insulation layer, the second substrate has a plurality of second bumps connecting to the end surfaces of the metal posts exposed from the opening portions of the mold resin layer, and the plurality of surface-treatment films is one of a plurality of Ni/Pd/Au films and a plurality of Ni/Au films.

13. A package-on-package device according to claim 12, wherein each of the metal posts has a seed layer formed on a sidewall surface of each of the metal posts.

14. A package-on-package device according to claim 12, wherein the plurality of metal posts is formed on the second pads in the peripheral portion of the interlayer resin insulation layer, respectively, at a pitch in a range of 0.3 mm or smaller.

15. A package-on-package device according to claim 14, wherein each of the metal posts has a diameter in a range of 50 to 150 µm and an aspect ratio in a range of 0.6 to 3.

16. A package-on-package device according to claim 12, wherein the interlayer resin insulation layer is an outermost interlayer resin insulation layer, and the resin insulation layer is a solder-resist layer.

17. A printed wiring board according to claim 4, wherein the plurality of metal posts comprises an electrolytic plating material.

18. A printed wiring board according to claim 4, wherein the interlayer resin insulation layer is an outermost interlayer resin insulation layer, and the resin insulation layer is a solder-resist layer.

19. A printed wiring board according to claim 6, wherein the plurality of metal posts comprises an electrolytic plating material.

20. A printed wiring board according to claim 6, wherein the interlayer resin insulation layer is an outermost interlayer resin insulation layer, and the resin insulation layer is a solder-resist layer.

* * * * *